United States Patent
Shalvi et al.

(10) Patent No.: US 9,983,929 B2
(45) Date of Patent: May 29, 2018

(54) REDUNDANT DATA STORAGE SCHEMES FOR MULTI-DIE MEMORY SYSTEMS

(71) Applicant: Apple Inc., Cupertino, CA (US)

(72) Inventors: Ofir Shalvi, Ra'anana (IL); Naftali Sommer, Rishon le-Zion (IL); Uri Perlmutter, Ra'anana (IL); Julian Vlaiko, Kfar Saba (IL); Moshe Neerman, Hadera (IL)

(73) Assignee: Apple Inc., Cupertino, CA (US)

( * ) Notice: Subject to any disclaimer, the term of this patent is extended or adjusted under 35 U.S.C. 154(b) by 33 days.

(21) Appl. No.: 15/191,103

(22) Filed: Jun. 23, 2016

(65) Prior Publication Data
US 2016/0299814 A1    Oct. 13, 2016

Related U.S. Application Data

(63) Continuation of application No. 14/662,360, filed on Mar. 19, 2015, now Pat. No. 9,400,710, which is a continuation of application No. 14/173,245, filed on Feb. 5, 2014, now Pat. No. 9,015,559, which is a continuation of application No. 12/987,175, filed on Jan. 10, 2011, now Pat. No. 8,677,203.

(60) Provisional application No. 61/373,883, filed on Aug. 16, 2010, provisional application No. 61/364,406, (Continued)

(51) Int. Cl.
| | |
|---|---|
| G06F 11/00 | (2006.01) |
| G06F 11/10 | (2006.01) |
| G06F 11/14 | (2006.01) |
| G06F 11/16 | (2006.01) |
| G06F 12/02 | (2006.01) |
| G06F 3/06 | (2006.01) |
| G11C 29/52 | (2006.01) |

(52) U.S. Cl.
CPC .......... *G06F 11/1068* (2013.01); *G06F 3/064* (2013.01); *G06F 3/065* (2013.01); *G06F 3/0619* (2013.01); *G06F 3/0655* (2013.01); *G06F 3/0688* (2013.01); *G06F 11/108* (2013.01); *G06F 11/1016* (2013.01); *G06F 11/14* (2013.01); *G06F 11/1666* (2013.01); *G06F 12/023* (2013.01); *G06F 12/0246* (2013.01); *G11C 29/52* (2013.01); *G06F 2212/7205* (2013.01); *G06F 2212/7208* (2013.01)

(58) Field of Classification Search
None
See application file for complete search history.

(56) References Cited

U.S. PATENT DOCUMENTS

| | | | | |
|---|---|---|---|---|
| 5,898,868 | A | * 4/1999 | Krueger | ............. G06F 11/1435 707/801 |
| 6,065,020 | A | 5/2000 | Dussud | |

(Continued)

*Primary Examiner* — Daniel McMahon
(74) *Attorney, Agent, or Firm* — Meyertons, Hood, Kivlin, Kowert & Goetzel, P.C.

(57) ABSTRACT

A method for data storage includes storing data in a memory that includes one or more memory units, each memory unit including memory blocks. The stored data is compacted by copying at least a portion of the data from a first memory block to a second memory block, and subsequently erasing the first memory block. Upon detecting a failure in the second memory block after copying the portion of the data and before erasure of the first memory block, the portion of the data is recovered by reading the portion from the first memory block.

20 Claims, 5 Drawing Sheets

Related U.S. Application Data filed on Jul. 15, 2010, provisional application No. 61/293,808, filed on Jan. 11, 2010.

(56) References Cited

U.S. PATENT DOCUMENTS

| | | | | |
|---|---|---|---|---|
| 6,134,143 | A | * | 10/2000 | Norman ................. G11C 16/06 365/185.07 |
| 6,412,080 | B1 | * | 6/2002 | Fleming .............. G06F 12/0246 711/103 |
| 8,140,945 | B2 | * | 3/2012 | Cypher .................. G06F 11/10 714/758 |
| 8,626,986 | B2 | | 1/2014 | Wu et al. |
| 2004/0003337 | A1 | * | 1/2004 | Cypher ............... G06F 11/1008 714/763 |
| 2006/0039196 | A1 | * | 2/2006 | Gorobets .............. G06F 11/106 365/185.01 |
| 2007/0100919 | A1 | | 5/2007 | Lee et al. |
| 2008/0082596 | A1 | | 4/2008 | Gorobets |
| 2008/0198650 | A1 | * | 8/2008 | Shalvi .................... G11C 16/26 365/185.02 |
| 2010/0157641 | A1 | * | 6/2010 | Shalvi ................. G11C 16/349 365/45 |
| 2012/0221913 | A1 | * | 8/2012 | Anholt ............... G06F 11/1012 714/752 |
| 2014/0157085 | A1 | * | 6/2014 | Shalvi .................... G06F 11/14 714/768 |
| 2014/0229774 | A1 | * | 8/2014 | Melik-Martirosian ......... G11C 16/349 714/704 |

\* cited by examiner

REDUNDANT DATA STORAGE SCHEMES FOR MULTI-DIE MEMORY SYSTEMS

CROSS-REFERENCE TO RELATED APPLICATIONS

This application is a continuation of U.S. patent application Ser. No. 14/662,360, filed Mar. 19, 2015, which is a continuation of U.S. patent application Ser. No. 14/173,245, filed Feb. 5, 2014, now U.S. Pat. No. 9,015,559, issued Apr. 21, 2015, which is a continuation of U.S. patent Ser. No. 12/987,175, filed Jan. 10, 2011, now U.S. Pat. No. 8,667, 203, issued Mar. 18, 2014, which claims the benefit of U.S. Provisional Patent Application 61/293,808, filed Jan. 11, 2010, U.S. Provisional Patent Application 61/364,406, filed Jul. 15, 2010, and U.S. Provisional Patent Application 61/373,883, filed Aug. 16, 2010, whose disclosures are incorporated herein by reference. This application is related to a U.S. patent application Ser. No. 12/987,174 entitled "Redundant data storage in multi-die memory systems", filed on even date, whose disclosure is incorporated herein by reference.

TECHNICAL FIELD

Embodiments described herein are related to the field of memory devices, and particularly to methods and systems for redundant data storage in memory systems.

BACKGROUND

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible programming levels. Higher-density devices, often referred to as Multi-Level Cell (MLC) devices, store two or more bits per memory cell, i.e., can be programmed to assume more than two possible programming levels.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

Some non-volatile memory systems store data in redundant configurations in order to increase storage reliability and reduce the likelihood of data loss. For example, U.S. Patent Application Publication 2010/0017650, whose disclosure is incorporated herein by reference, describes a non-volatile memory data storage system, which includes a host interface for communicating with an external host, and a main storage including a first plurality of Flash memory devices. Each memory device includes a second plurality of memory blocks. A third plurality of first stage controllers are coupled to the first plurality of Flash memory devices. A second stage controller is coupled to the host interface and the third plurality of first stage controller through an internal interface. The second stage controller is configured to perform Redundant Array of Independent Disks (RAID) operation for data recovery according to at least one parity.

As another example, U.S. Patent Application Publication 2009/0204872, whose disclosure is incorporated herein by reference, describes a Flash module having raw-NAND Flash memory chips accessed over a Physical-Block Address (PBA) bus by a controller. The controller converts logical block addresses to physical block addresses. In some embodiments, data can be arranged to provide redundant storage, which is similar to a RAID system, in order to improve system reliability.

BRIEF SUMMARY

An embodiment provides a method for data storage. The method includes storing data in a memory that includes one or more memory units, each memory unit including memory blocks. The stored data is compacted by copying at least a portion of the data from a first memory block to a second memory block, and subsequently erasing the first memory block. Upon detecting a failure in the second memory block after copying the portion of the data and before erasure of the first memory block, the portion of the data is recovered by reading the portion from the first memory block.

In some embodiments, compacting the stored data includes delaying erasure of the first memory block. In an embodiment, the memory includes at least first and second memory units, the first memory block is located in the first memory unit and the second memory block is located in the second memory unit.

There is additionally provided, in accordance with an embodiment, a method for data storage. The method includes accepting data for storage in a memory that includes multiple memory units. The data is encoded with an Error Correction Code (ECC), to produce an ECC code word including multiple bits. Respective subsets of the bits of the code word are stored in the multiple memory units. Upon a failure in a given memory unit, the code word is decoded using the bits that are stored in the memory units other than the given memory unit.

Decoding the code word may include associating the bits with respective soft metrics, and decoding the code word responsively to the soft metrics. In another embodiment, decoding the code word includes marking a subset of the bits that is stored in the given memory unit as erasures, and decoding the code word responsively to the erasures.

In yet another embodiment, storing the subsets includes assigning the subsets of the bits respective logical addresses that are mapped to physical storage locations in the respective memory units. In an embodiment, the ECC code word includes data and redundancy information, and the method includes selecting an additional set of the logical addresses for storing additional data and additional redundancy information, such that the logical addresses that are assigned for storing the additional redundancy information in the additional set are mapped to a different subset of the memory units, in comparison with the logical addresses that are assigned for storing the redundancy information in the ECC code word.

In still another embodiment, the memory units are assigned respective, non-overlapping ranges of the logical addresses. In an embodiment, accepting the data includes receiving the data from a host, and assigning the logical addresses includes allocating the logical addresses from a range of the logical addresses that is not accessible to the host.

In some embodiments, the method includes reserving at least one spare memory unit in addition to the multiple memory units, and replacing the failed given memory unit with the spare memory unit. In some embodiments, the method includes temporarily using the spare memory unit for improving performance of data storage in the multiple memory units. In an embodiment, the memory units are partitioned into two or more groups that are associated with respective two or more processors, and storing the subsets includes distributing storage of the subsets among the multiple processors.

There is additionally provided, in accordance with an embodiment, a method for data storage in a memory that includes at least N memory units. The method includes defining a mapping between logical addresses and respective physical storage locations in the memory units. A set of N logical addresses, which are mapped to N respective physical storage locations in different ones of the memory units, is selected such that K of the logical addresses in the set, $1 \leq K \leq N$, are assigned for data storage and N−K logical addresses in the set, other than the K logical addresses, are assigned for storing redundancy information. Data is accepted for storage in the K logical addresses in the set. The redundancy information is computed for the data. The data is stored in the K logical addresses at a first storage density, and the redundancy information is stored in the N−K logical addresses at a second storage density that is lower than the first storage density.

In some embodiments, the method includes selecting an additional set of the logical addresses for storing additional data and additional redundancy information, such that the logical addresses that are assigned for storing the additional redundancy information in the additional set are mapped to a different subset of the memory units, in comparison with the logical addresses that are assigned for storing the redundancy information in the set. In an embodiment, the memory units are assigned respective, non-overlapping ranges of the logical addresses, and selecting the set includes choosing the N logical addresses from the respective ranges.

In an embodiment, accepting the data includes receiving the data from a host, and selecting the set includes assigning the N−K logical addresses from a range of the logical addresses that is not accessible to the host. In another embodiment, the method includes reserving at least one spare memory unit in addition to the N memory units, and replacing a failed memory unit from among the N memory units with the spare memory unit. The method may include temporarily using the spare memory unit for improving performance of data storage in the N memory units. In an embodiment, the memory units are partitioned into multiple groups that are associated with respective multiple processors, and storing the data and the redundancy information includes distributing storage of the data and the redundancy information among the multiple processors.

There is further provided, in accordance with an embodiment, a method for data storage in a memory controller that performs data storage in a memory that includes multiple memory units. The method includes producing N+K data units, $K \geq 1$, such that N of the data units include data and remaining K data units include redundancy information calculated over the data. The N+K data units are stored in respective different N+K memory units. After storing the data units, a subset of the memory units that are fastest to respond to readout requests is determined. The stored data is reconstructed based only on the data units stored in the memory units in the subset.

In some embodiments, determining the subset and reconstructing the data include issuing up to N+K respective read commands to up to N+K of the memory units, receiving responses that are fastest to arrive in response to the read commands, and reconstructing the data based only on the fastest responses. In an embodiment, determining the subset includes receiving from the memory units respective indications of expected latencies in responding to the read commands, and selecting the subset based on the indications.

In another embodiment, the method includes scheduling background tasks for execution by the N+K memory units such that a certain portion of the memory units do not execute the background tasks at any given time. In a disclosed embodiment, reconstructing the data includes reconstructing a given data unit stored in a given memory unit that does not belong to the subset, and the method includes providing the reconstructed given data unit to the given memory unit, so as to cause the given memory unit to improve subsequent readout using the given data unit.

There is further provided, in accordance with an embodiment, a data storage apparatus that includes an interface and a processor. The interface is configured to communicate with a memory that includes one or more memory units, each memory unit including memory blocks. The processor is configured to store data in the memory, to compact the stored data by copying at least a portion of the data from a first memory block to a second memory block and subsequently erasing the first memory block, and, upon detecting a failure in the second memory block after copying the portion of the data and before erasure of the first memory block, to recover the portion of the data by reading the portion from the first memory block.

There is also provided, in accordance with an embodiment, a data storage apparatus that includes an interface and a processor. The interface is configured to communicate with a memory that includes multiple memory units. The processor is configured to accept data for storage in the memory, to encode the data with an Error Correction Code (ECC) so as to produce an ECC code word including multiple bits, to store respective subsets of the bits of the code word in the multiple memory units, and, upon a failure in a given memory unit, to decode the code word using the bits that are stored in the memory units other than the given memory unit.

There is further provided, in accordance with an embodiment, a data storage apparatus that includes an interface and a processor. The interface is configured to communicate with a memory that includes at least N memory units. The processor is configured to define a mapping between logical addresses and respective physical storage locations in the memory units, to select a set of N logical addresses, which are mapped to N respective physical storage locations in different ones of the memory units, such that K of the logical addresses in the set, $1 \leq K \leq N$, are assigned for data storage and N−K logical addresses in the set, other than the K logical addresses, are assigned for storing redundancy information, to accept data for storage in the K logical addresses in the set, to compute the redundancy information for the data, to store the data in the K logical addresses at a first storage density, and to store the redundancy information in the N−K logical addresses at a second storage density that is lower than the first storage density.

There is additionally provided, in accordance with an embodiment, a data storage apparatus that includes an interface and a processor. The interface is configured to communicate with a memory that includes at multiple memory units. The processor is configured to produce N+K data units, $K \geq 1$, such that N of the data units include data and remaining K data units include redundancy information calculated over the data, to store the N+K data units in respective different N+K memory units, to determine, after storing the data units, a subset of the memory units that are fastest to respond to readout requests, and to reconstruct the stored data based only on the data units stored in the memory units in the subset.

These and other embodiments will be more fully understood from the following detailed description, taken together with the drawings in which:

DETAILED DESCRIPTION OF EMBODIMENTS

Overview

Figure 1:
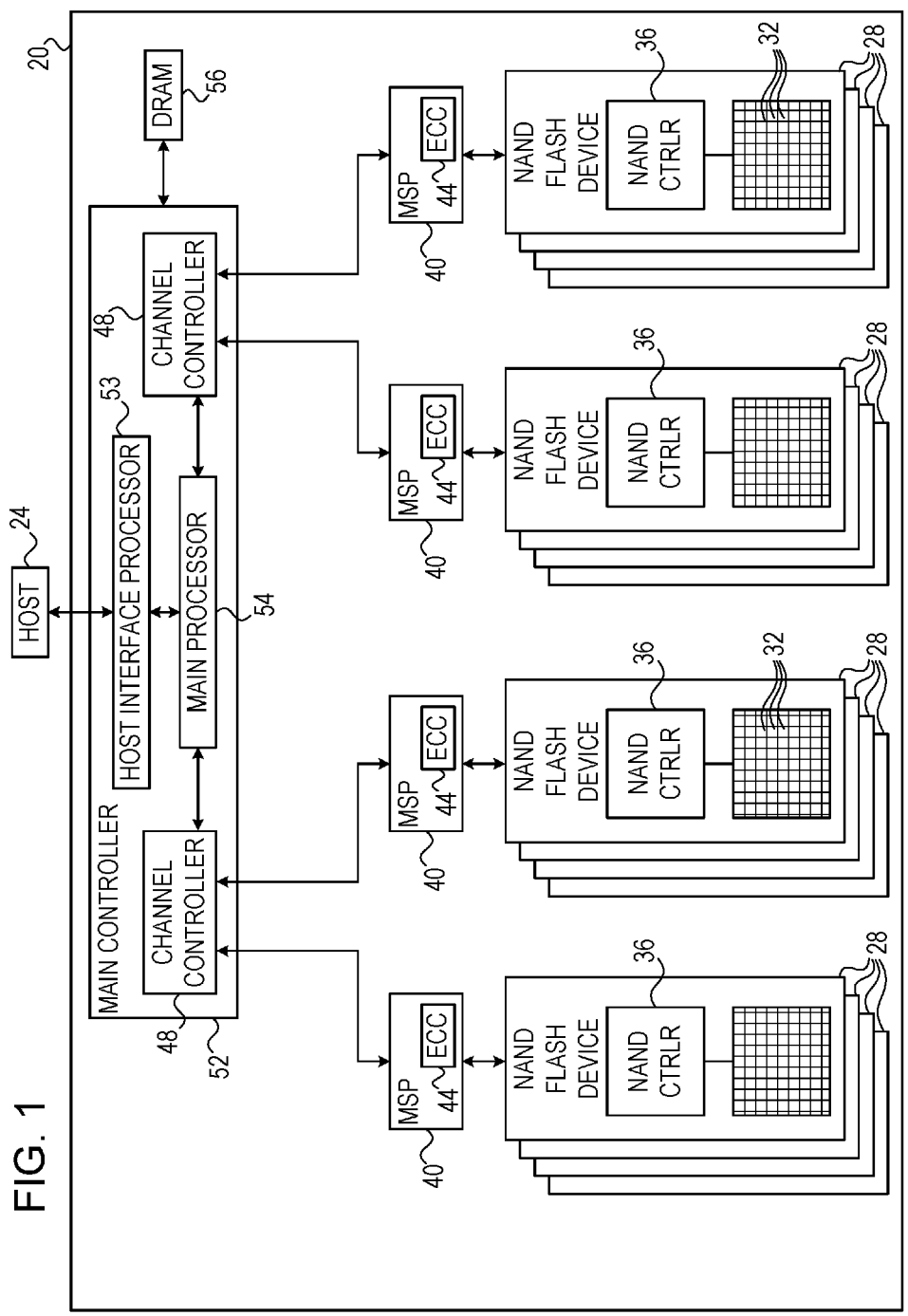
FIG. 1 is a block diagram that schematically illustrates a memory system, in accordance with an embodiment.

Embodiments are described hereinbelow provide improved methods and systems for redundant data storage in solid-state non-volatile memory, such as Flash memory. The disclosed techniques may be carried out, for example, by a memory controller that stores data in multiple memory units, such as individual memory dies or packaged memory devices. The methods described herein enable the memory controller to recover the stored data in the event of memory unit failure. Typically, these methods involve accepting data for storage from a host, computing redundancy information for the data, and storing the data and the redundancy information in different memory units.

Data storage in solid-state non-volatile memory, e.g., Flash memory, has several unique characteristics relative to other storage media:
  Data is typically stored page by page, but erased block by block. Each block comprises multiple pages.
  Stored data cannot be updated in-place, and therefore updated data is typically stored in another physical location.
  The memory is specified to endure only a limited number of programming and erasure cycles.

In some embodiments, the memory controller stores data efficiently in spite of the above-described characteristics by using logical addressing. Typically, the host addresses the data for storage using logical addresses. The memory controller maps the logical addresses to respective physical storage locations for storing the data. When the host updates the data corresponding to a certain logical address, the memory controller stores the updated data in a new physical storage location, updates the logical-physical address mapping to remap the logical address to the new physical storage location, and marks the previous physical storage location as invalid. As data storage continues, particularly for non-sequential storage, the blocks gradually develop regions of invalid data ("holes"). The memory controller typically carries out a "garbage collection" process, which copies valid data from partially-valid blocks and stores the data compactly in other blocks. The cleared blocks are subsequently erased in preparation for storing new data.

The unique characteristics of solid-state non-volatile memory may have a particularly adverse effect on the performance of redundant storage schemes that are known in the art. For example, when implementing a redundant storage scheme, the redundancy information is typically updated whenever the data is updated, thus causing a considerable increase in the number of programming operations. This increase may be tolerable in some storage media types, but not in non-volatile solid-state devices that degrade after a limited number of programming cycles. As will be explained below, the disclosed redundant storage schemes provide protection against memory unit failure while minimizing the effects of redundant storage on the lifetime and performance of the system.

In some embodiments, the memory controller performs redundant storage based on the physical storage locations assigned to the data. In these embodiments, the memory controller defines sets of memory blocks that are referred to as superblocks. Each superblock comprises N blocks, each selected from a different memory unit. Each set of N corresponding pages (with one page from each block) in a given superblock is referred to as a super-page. Data storage is carried out such that the N pages belonging to a given super-page are programmed together, and the N blocks belonging to a given superblock are erased together. Compaction of the memory is also performed in superblocks. The term "together" in this context means that no intervening programming operations are permitted to the super-page during programming of the N pages, and no intervening programming operations are permitted to the superblock during compaction or erasure of the N blocks.

The memory controller stores data in a given N-page super-page by accumulating N−K data pages ($1 \leq K \leq N$) in a buffer, computing K pages of redundancy information for the N−K data pages, and storing the N−K data pages and K pages of redundancy information together in the N pages of the super-page. As a result, the redundancy information is updated only once per N−K data pages and not per each incoming data page. Thus, fewer additional programming operations are caused by the redundant storage. In addition, the memory controller performs garbage collection by compacting and erasing entire superblocks rather than individual blocks, so as to provide empty superblocks for subsequent redundant data storage.

In alternative embodiments, the memory controller performs redundant storage based on the logical addresses assigned to the data. In an example embodiment, the memory controller selects N logical addresses, which are mapped respectively to N physical storage locations that reside in N different memory units. When data is accepted for storage from the host, the memory controller uses N−K of these addresses for storing data, and the remaining K pages for storing redundancy information. As can be appreciated, the logical addresses that are used for storing the redundancy information undergo a higher number of programming operations, relative to the logical addresses that are used for storing the data. Therefore, in some embodiments, the memory controller stores the redundancy information at a lower storage density than the storage density used for storing the data. The lower storage density increases the endurance of the redundancy information to severe cycling.

In some embodiments, the memory controller defines and applies the mapping between logical addresses and physical storage locations, but the redundancy scheme is defined and managed by the host. In these embodiments, the memory controller provides information regarding the logical-physical address mapping to the host, and the host uses this information to define the redundancy scheme. In an example embodiment, the host defines the logical addresses such that the data and the redundancy information will be stored in different memory units.

In some embodiments, the memory controller uses invalid data, which remains in obsolete blocks that were cleared by the garbage collection process, as temporary backup. In an example embodiment, the garbage collection process is defined such that valid data is read from a source block in one memory unit, and then written to a destination block in a different memory unit. If the memory unit holding the destination block fails, and the memory unit holding the (obsolete) source block was not erased yet, the memory controller recovers the data in question from the source block. In some embodiments, the memory controller delays erasure of obsolete source blocks as much as possible, in order to increase the availability of such temporary backup.

In some embodiments, the memory controller protects the stored data against memory unit failure by encoding the data with an Error Correction Code (ECC), and distributes the bits of each ECC code word over multiple memory units. Typically, the ECC and the number of memory units are selected such that the code word is still decodable when all the bits stored in a given memory unit are lost. In an embodiment, the bits that are stored in a failed memory unit are identified to the ECC decoder as erasures.

In some embodiments, the memory controller stores data in N memory units, and redundancy information for the data in an N+$1^{th}$ memory unit. In order to retrieve the data, the memory controller issues a respective read command to each of the N+1 memory units. As soon as responses for the first N read commands (which may comprise data and/or redundancy information) arrive, the memory controller reconstructs the data from the N responses without waiting for the N+$1^{th}$ response. Using this technique, data readout is not sensitive to temporarily slow response times, e.g., to delays caused by memory units that are busy with other tasks.

System Description

FIG. 1 is a block diagram that schematically illustrates a multi-device memory system 20, in accordance with an embodiment. System 20 accepts data for storage from a host 24 and stores it in memory, and retrieves data from memory and provides it to the host. In the present example, system 20 comprises a Solid-State Disk (SSD) that stores data for a host computer. In alternative embodiments, however, system 20 may be used in any other suitable application and with any other suitable host, such as in computing devices, cellular phones or other communication terminals, removable memory modules such as Disk-On-Key (DOK) devices, Secure Digital (SD) cards, Multi-Media Cards (MMC) and embedded MMC (eMMC), digital cameras, music and other media players and/or any other system or device in which data is stored and retrieved.

System 20 comprises multiple non-volatile memory devices 28, each comprising multiple analog memory cells 32. In the present example, devices 28 comprise NAND Flash devices, although various other suitable solid state memory types, such as NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells, can also be used.

In the context of the present patent application and in the claims, the term "analog memory cell" is used to describe any memory cell that holds a continuous, analog value of a physical parameter, such as an electrical voltage or charge. Any suitable type of analog memory cells, such as the types listed above, can be used. In the present example, each memory device 28 comprises a non-volatile memory of NAND Flash cells. The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

In each memory device 28, data is stored in memory cells 32 by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell. Memory cells 32 are typically arranged in one or more memory arrays ("planes"), each comprising multiple rows and columns. The memory cells in each row are connected to a respective word line, and the memory cells in each column are connected to a respective bit line.

Each memory array is typically divided into multiple pages, i.e., groups of memory cells that are programmed and read simultaneously. Pages are sometimes sub-divided into sectors. In some embodiments, each page occupies an entire row of the array, i.e., an entire word line. For two-bit-per-cell devices, for example, each word line stores two pages. In alternative embodiments, each row (word line) can be divided into two or more pages. For example, in some devices each row is divided into two pages, one comprising the odd-order cells and the other comprising the even-order cells. In an example implementation, a two-bit-per-cell memory device may have four pages per row, a three-bit-per-cell memory device may have six pages per row, and a four-bit-per-cell memory device may have eight pages per row.

Typically, a given memory device comprises multiple erasure blocks (also referred to as memory blocks), i.e., groups of memory cells that are erased together. Each memory device 28 may comprise a packaged device or an unpackaged semiconductor chip or die. In some embodiments, each memory device 28 comprises multiple dies. A typical SSD may comprise a number of 4 GB devices. Generally, however, system 20 may comprise any suitable number of memory devices of any desired type and size.

Each memory device 28 comprises an internal NAND controller 36, which stores data in the memory cells of the device. Each NAND controller 36 performs data storage and retrieval in its respective memory device in response to NAND commands. Each NAND command typically specifies writing or reading of a single memory page in the memory device. In system 20, data storage in memory devices 28 is carried out by a hierarchical configuration of processors and controllers, which provides a high degree of parallelization of storage tasks, and therefore achieves high storage throughput with small latency.

Memory devices 28 in system 20 are arranged in subsets. A Memory Signal Processor (MSP) 40 is associated with each subset and performs data storage and retrieval in the subset. In some embodiments, each MSP 40 comprises an Error Correction Code (ECC) unit 44, which encodes the data for storage with a suitable ECC, and decodes the ECC of data retrieved from memory. In some embodiments, the subsets of memory devices 28 (each with its respective MSP) are aggregated into groups that are referred to as channels.

System 20 comprises a main controller 52, which manages the system operation. Main controller 52 comprises multiple channel controllers 48, each responsible for data storage and retrieval in a respective channel. The main controller accepts commands from host 24 to store and/or retrieve data, and communicates with the MSPs in order to carry out these commands. Typically, the communication between the main controller and the channel controllers, between the channel controllers and MSPs, and between the MSPs and the NAND controllers, comprise both data and control aspects.

In some embodiments, main controller 52 comprises a host interface processor 53 and a main processor 54. The host interface processor forwards host commands between main controller 54 and host 24, and forwards data between the MSPs and the host. Main processor 54 executes the host commands, performs Flash management functions on memory devices 28, and communicates with the MSPs. In alternative embodiments, any other suitable main controller configuration can also be used. For example, Flash management functions may be partitioned between main processor 54 and MSPs 40. In some embodiments, the system comprises volatile memory, in the present example one or more Dynamic Random Access Memory (DRAM) devices 56, connected to main controller 52.

In an example embodiment, system 20 comprises a total of eight channel controllers 48 and thirty-two MSPs 40, i.e., each channel controller manages four MSPs. In this configuration, each MSP may manage between one and eight memory devices 28. A given memory device 28 may comprise multiple dies. Alternatively, however, any other suitable numbers of channel controllers, MSPs and memory devices can also be used. The number of memory devices managed by each MSP may differ, for example, according to the storage capacity of system 20 and the storage density of devices 28. In some embodiments, the channel controllers may be omitted. In these embodiments, the main controller stores and retrieves data by communicating directly with the MSPs.

In some embodiments, system 20 performs logical-to-physical address translation for storing data in memory devices 28. Typically, host 24 addresses the data using logical addresses. Main controller 52 maps each logical address to a respective physical storage location in memory devices 28. The mapping between logical addresses and physical storage locations may change over time, e.g., when data at a certain logical address is updated. Thus, main controller 52 typically maintains a data structure holding the current mapping between logical addresses and physical storage locations. This data structure can be stored, for example, in DRAM 56 or in memory devices 28.

The functions of NAND controllers 36, MSPs 40, channel controllers 48 and main controller 52 may be implemented, for example, using software running on suitable Central Processing Units (CPUs), using hardware (e.g., state machines or other logic), or using a combination of software and hardware elements. In some embodiments, NAND controllers 36, MSPs 40, channel controllers 48 and/or main controller 52 may comprise general-purpose processors, which are programmed in software to carry out the functions described herein. The software may be downloaded to the processors in electronic form, over a network, for example, or it may, alternatively or additionally, be provided and/or stored on non-transitory tangible media, such as magnetic, optical, or electronic memory.

The system configuration of FIG. 1 is an example configuration, which is shown purely for the sake of conceptual clarity. In alternative embodiments, any other suitable memory system configuration can also be used. Elements that are not necessary for understanding the principles of the embodiments, such as various interfaces, addressing circuits, timing and sequencing circuits and debugging circuits, have been omitted from the figure for clarity.

In the exemplary system configuration shown in FIG. 1, the channel controllers are comprised in the main controller, and the main controller, MSPs and memory devices are implemented as separate Integrated Circuits (ICs). In an alternative embodiment, memory devices 28, MSPs 40, channel controllers 48 and main controller 52 may be implemented as separate ICs. Alternatively, each subset of devices 28 with its respective MSP, can be fabricated on a common die or device. Further alternatively, the MSPs, channel controllers and main controller may be fabricated in a common Multi-Chip Package (MCP) or System-on-Chip (SoC), separate from memory devices 28 and DRAM 56. In alternative embodiments, the elements of system 20 can be partitioned into packaged ICs or semiconductor dies in any other suitable way. Further alternatively, some or all of the functionality of main controller 52 can be implemented in software and carried out by a processor or other element of the host system. In some embodiments, host 24 and main controller 52 may be fabricated on the same die, or on separate dies in the same device package. The main controller, channel controllers, MSPs and NAND controllers are collectively regarded herein as a memory controller, which carries out the methods described herein.

Redundant Data Storage in Non-Volatile Memory

In some embodiments, system 20 stores data in devices 28 using a redundant configuration, which provides protection against hardware failures. Typically, system 20 stores certain data by computing redundancy information for the data, distributing the data over N−1 storage locations, and storing the redundancy information in an $N^{th}$ storage location (N≥2). The N storage locations are typically selected to reside in different memory units, e.g., different dies, memory devices or channels. When using this sort of redundancy, the data can be recovered using the redundancy information even in the event of memory unit failure.

The term "redundancy information" is used herein to describe any information that enables recovering the data in the event that parts of the data are lost or corrupted. In an example embodiment, the redundancy information comprises a bit-wise exclusive-OR (XOR) of the N−1 data portions. In another embodiment, the data is encoded with an Error Correction Code (ECC) that produces redundancy bits, the data is stored in N−1 locations, and the redundancy bits are stored in the $N^{th}$ location. Further alternatively, any other suitable type of redundancy information can also be used.

Although the embodiments described herein refer mainly to storage of data in N−1 locations and redundancy information in an additional $N^{th}$ location, the disclosed techniques are not limited to this configuration. In alternative embodiments, system 20 may store the data in N−K locations, 1≤K≤N, and store the redundancy information in K locations.

The description that follows refers mainly to memory dies as the basic memory unit. This choice, however, is made purely by way of example. In alternative embodiments, the techniques described herein can be applied to any other suitable memory units, such as groups of dies, individual memory devices, groups of memory devices, or SSD channels. Further alternatively, each memory unit may comprise a memory plane or even a word line, group of word lines or memory block. Typically, a configuration that spreads the data and redundancy across multiple memory units provides protection against failure of that type of memory unit. For example, when the basic memory unit is a die, the disclosed techniques provide protection against die failure. When the basic memory unit is a SSD channel, the disclosed techniques provide protection against channel failure.

Data storage in non-volatile memory has certain unique characteristics. In particular: (1) data is stored page by page, (2) stored data cannot be updated in-place and therefore the updated data needs to be stored in another physical location, (3) data is erased block by block, each block containing multiple pages, and (4) non-volatile memory is specified to endure only a limited number of programming and erasure cycles. When implementing redundant storage schemes, these characteristics may have major impact on system performance.

Consider, for example, N−1 data portions that are stored in N−1 blocks, and redundancy information that is stored in an $N^{th}$ block. Updating any portion of the data involves updating the redundancy information, as well. Therefore, each data portion update causes two programming operations—one for updating the data portion and one for updating the redundancy information. As a result, the total number of programming and erasure cycles in the system may increase considerably. Moreover, the storage location holding the redundancy information may suffer from severe cycling and wearing, since it is updated for any data portion update.

Various embodiments provide improved methods and systems for redundant storage in non-volatile memory. These techniques provide protection against memory unit failure, while minimizing the effects of redundant storage on the lifetime and performance of the system.

With reference to FIG. 1, the disclosed techniques may be carried out by main processor 54, channel controllers 48, MSPs 40, NAND controllers 36, or any suitable combination or subset of these processors. The processor or processors that carry out the disclosed techniques in a given configuration is sometimes referred to as "processing circuitry." The disclosed techniques can be partitioned among the different processors in any suitable way.

Redundant Storage in Non-Volatile Memory Using Superblocks

In some embodiments, system 20 defines superblocks by associating memory blocks from different dies. Each superblock comprises N blocks, each block selected from a different die. In some embodiments, each set of N corresponding pages in the N blocks of a given superblock is referred to as a super-page. All the blocks in a given superblock are compacted and erased together, and all the pages in a given super-page are programmed together.

Figure 2:
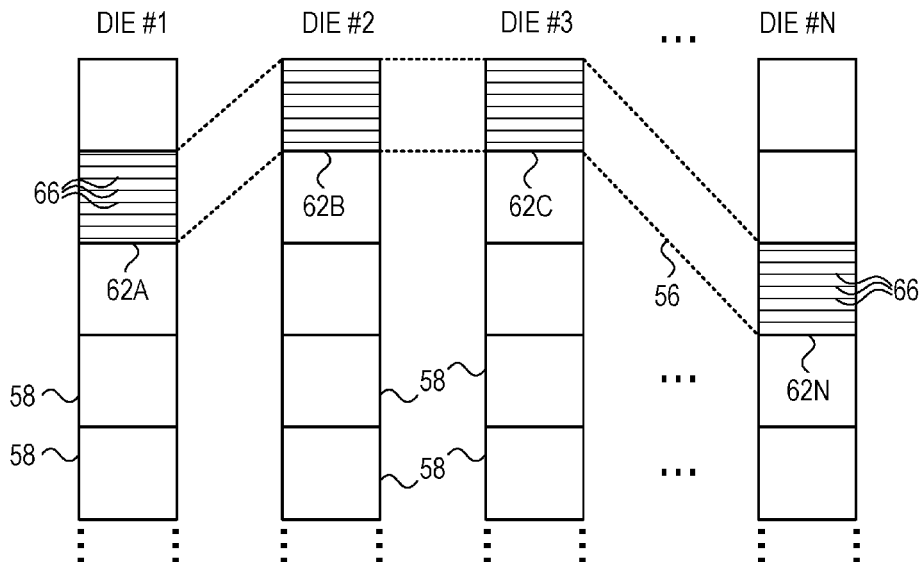
FIG. 2 is a diagram that schematically illustrates a memory superblock, in accordance with an embodiment.

FIG. 2 is a diagram that schematically illustrates a memory superblock, in accordance with an embodiment. The example of FIG. 2 shows N memory dies denoted #1 . . . #N, each die comprising multiple memory blocks 58. The figure shows a superblock 56, which comprises N blocks 62A . . . 62N. Each block in the superblock resides in a different die. As will be explained below, all the blocks in the superblock are erased together when system 20 compacts the data that is stored in memory.

Each memory block 58 comprises multiple pages 66. In some embodiments, system 20 regards each set of corresponding pages in the superblock (i.e., N pages, one from each block of the superblock) as a super-page. The pages of a given super-page are programmed together. As can be seen in the figure, the blocks of a given superblock are not necessarily located in the same location in their respective dies. Similarly, the pages of a given super-page are not necessarily located in the same location in their respective blocks.

When using super-pages, system 20 accumulates N−1 pages of incoming data (e.g., in a volatile memory buffer) and then calculates the redundancy information for the N−1 pages. Then, system 20 stores the data and redundancy information in a single super-page—The data is stored in N−1 pages and the redundancy information in the $N^{th}$ page.

Therefore, the redundancy information ($N^{th}$ page) is updated only once per N−1 pages and not per each incoming page. This technique reduces the additional cycling caused by the redundant storage. If a certain die fails, system 20 can recover a given page stored in that die using (1) the other N−2 data pages in the super-page and (2) the redundancy information stored in the $N^{th}$ page of the super-page.

In some embodiments, system 20 carries out a "garbage collection" process, which compacts valid data that is stored in the different memory blocks and clears blocks for erasure and new programming. Data may become invalid, for example, when updated data for a certain logical address arrives, and is stored by the system in another physical location. The old data for this logical address is invalid, but cannot be erased immediately because the block may contain other data that is still valid. As the system continues to update data, regions of invalid data accumulate in the memory blocks. The garbage collection process compacts the data and attempts to minimize the invalid data regions.

(In the present context, the term "valid data" refers to the most recent copy of the data corresponding to a given logical address, or to the data that is pointed to by the system. Thus, data typically becomes invalid when a more recent copy of the data is stored and pointed to by the system. The term "invalid data" means a previous copy of certain data, which is no longer pointed to by the system.)

For example, the garbage collection process may consolidate valid data from two or more blocks into one or more new blocks. As another example, the garbage collection process may copy data from a partially-valid block (i.e., a block having some valid and some invalid pages) into a new block. A process of this sort may be carried out when new data arrives, or as a background process. Typically, the garbage collection process copies valid data from one or more partially-valid blocks to other blocks, and then erases the partially-valid blocks that are now obsolete. The erased blocks are available for new programming.

In some embodiments, system 20 carries out the compaction and garbage collection process at a superblock level. In particular, system 20 erases all the blocks of a given superblock together. If the total number of blocks is sufficiently large, the number of actual write operations per user write ("write efficiency") does not change significantly when garbage collection is done by blocks or by superblocks, because the percentage of valid data in each block (or superblock) that is merged during the garbage collection process is approximately the same. The advantage of performing garbage collection at the superblock level stems from the number of write operations that are needed for storing the redundancy information.

Assume, for example, that a single redundancy block is stored per N−1 data blocks. If garbage collection is carried out at the individual block level, then for the case of random data programming (i.e., the host sends programming commands to random logical addresses), whenever a block is changed, the appropriate redundancy block should also be changed, by issuing another block programming command to the same logical address of the former redundancy block (in a different memory device). Therefore, the number of block write operations for the case of random programming is doubled due to the need to update the redundancy.

On the other hand, if garbage collection is performed at the superblock level, the redundancy block is part of the same superblock as the data. Therefore, even for random write operations, only a single write operation is issued for each user write operation. Therefore, using superblock-level garbage collection vs. block level garbage collection doubles the programming speed and reduces the wear of the blocks by a factor of two.

The term "erased together" means that erasure of the memory blocks in a given superblock is performed without allowing any intervening programming operations on the superblock. In other words, the blocks in a superblock can be erased in parallel, semi-parallel or even sequentially, as long as no other programming operations are performed in the superblock until all the blocks are erased. Intervening readout operations may be allowed.

Figure 3:
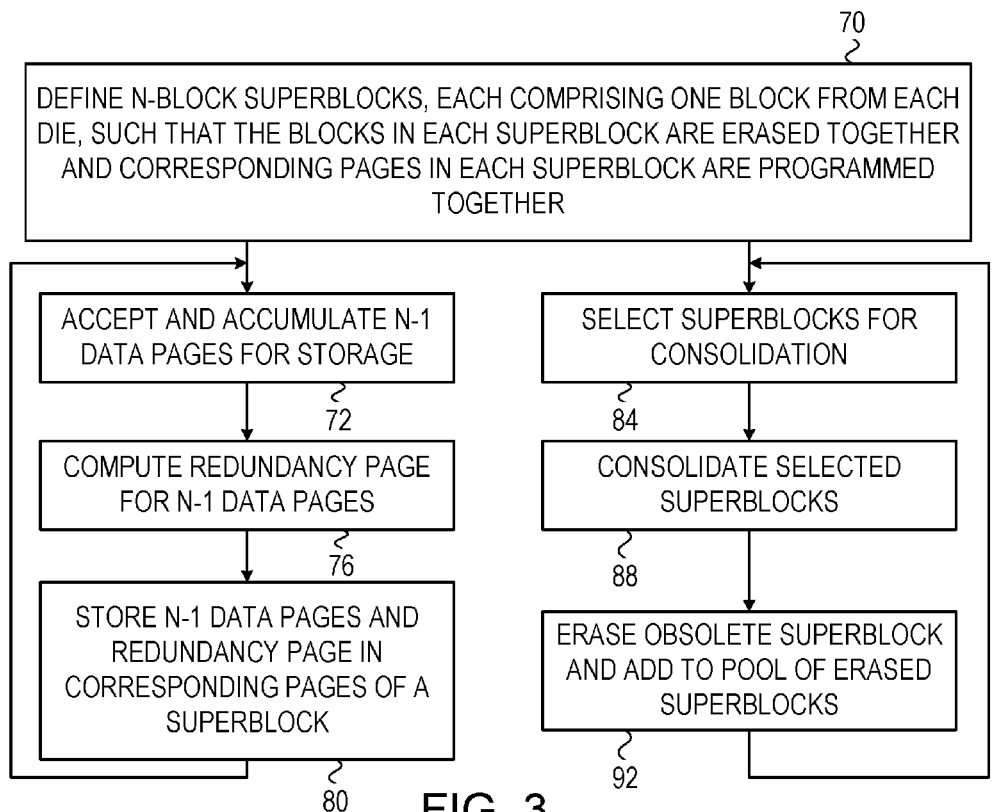
FIG. 3 is a flow chart that schematically illustrates a method for redundant data storage using superblocks, in accordance with an embodiment.

FIG. 3 is a flow chart that schematically illustrates a method for redundant data storage using superblocks, in accordance with an embodiment. The method begins with system 20 defining superblocks, and super-pages within the superblock, at a superblock definition step 70.

After defining the superblock, system 20 carries out two processes irrespective of one another, namely a data storage process and a garbage collection process. In the data storage process, system 20 accumulates N−1 pages of data that is accepted for storage from host 24, at a data accumulation step 72. The system computes redundancy information for the accumulated data, at a redundancy computation step 76. For example, the system may calculate the bit-wise XOR of the N−1 data pages, to produce an $N^{th}$ redundancy page. The system then stores the N pages (N−1 data pages and redundancy page) in the N pages of a given super-page, at a storage step 80. Thus, each of the N pages is stored on a different die. As a result, the data can be recovered using the redundancy information in the event of die failure.

In the garbage collection process, system 20 selects one or more partially-valid superblocks (superblocks whose blocks contain some valid and some invalid pages) for data consolidation (also referred to as compaction), at a superblock selection step 84. System 20 may select superblocks for compaction using any suitable criterion. Typically, the criterion depends on the distribution of invalid data in the superblocks. For example, the system may select to compact the superblocks having the largest number of invalid pages. The system then consolidates the valid data from the selected superblocks, at a data consolidation step 88. The compaction process may copy the valid data from two or more selected superblocks to a new superblock, copy the valid data from one partially-valid superblock into another partially-valid superblock, or copy the valid data from a single selected superblock to a new superblock, for example.

The compaction process of step 88 produces at least one obsolete superblock, whose valid data was copied to another superblock. System 20 erases the obsolete superblock, at a superblock erasure step 92. As noted above, all the blocks in the superblock are erased without allowing any intervening programming operations in the superblock.

When performing the compaction process of step 88, system 20 may copy valid data from a source superblock to a destination superblock using intra-die and/or inter-die copy operations. In some embodiments, the system allows valid data to be copied from a source block in one die to a destination block in a different die. For example, the system may read the valid data from the entire source superblock, and write it sequentially to the destination superblock. Allowing inter-die copy operations enables a high degree of flexibility, and potentially achieves tighter compaction. Inter-die copy operations may be particularly advantageous when the invalid pages ("holes") are not distributed uniformly across the blocks of the source superblock. On the other hand, inter-die copy operations cause considerable data traffic to pass through MSPs 40, channel controllers 48 and/or main processor 54.

In alternative embodiments, system 20 performs super-block compaction using only intra-die copy operations. In other words, when copying valid data from a source super-block to a destination superblock, data can only be copied between source and destination blocks in the same die. This limitation may degrade the compaction slightly, but on the other hand simplifies the compaction process significantly. For example, the copy operations can be performed by NAND controllers 36 internally in memory devices 28, without transferring data through the MSPs, channel controllers and main processor. Partial limitations are also possible. For example, inter-die copy operations may be permitted only between dies in the same memory device, between dies that are managed by the same MSP, or between dies that are managed by the same channel controller.

In some cases, after the valid data has been copied from the source superblock(s) to the destination superblock, the destination superblock in still not fully-programmed. In a scenario of this sort, system 20 may select an additional source superblock (e.g., the superblock having the next-highest number of invalid pages), and copy valid data from this superblock to the destination superblock. The system marks the copied pages as invalid in the new source super-block. If necessary, this process can be repeated (by progressively adding additional source superblocks) until the destination superblock is full.

Figure 4:
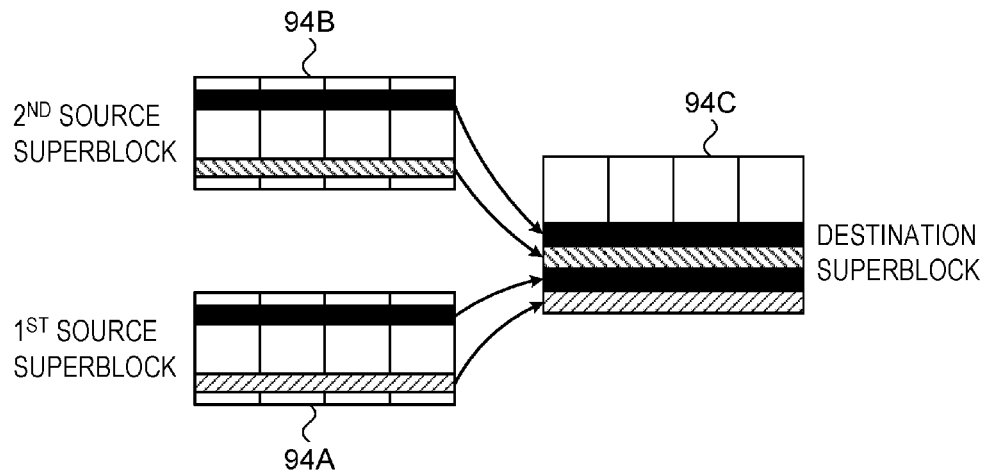
FIG. 4 is a diagram that schematically illustrates a process of superblock compaction, in accordance with an embodiment.

FIG. 4 is a diagram that schematically illustrates a process of superblock compaction, in accordance with an embodiment. Initially, a first source superblock 94 is compacted into a destination superblock 94C. As can be seen in the figure, the valid super-pages in superblock 94A are fragmented, and the memory controller thus copies them in a compact manner to superblock 94C. After superblock 94A has been compacted and cleared for erasure, the memory controller selects superblock 94B as the next superblock for compaction. Since destination superblock 94C still has super-pages that are available for programming, the memory controller copies the valid super-pages from source superblock 94B to destination superblock 94C. This process may continue as long as the destination superblock is not full.

In some cases, the number of invalid pages ("holes") may vary considerably from die to die. For example, some dies may hold static data that is rarely updated, and therefore have few invalid pages. Other dies may hold data that is updated frequently, and therefore have a large number of invalid pages. In system configurations that allow only intra-die copy, the compaction of superblocks may be degraded considerably. In some embodiments, system 20 avoids unbalanced scenarios of this sort by running a background process that copies blocks from die to die.

In some embodiments, system 20 classifies the data for storage to rarely-updated ("static" or "cold") data and frequently-updated ("dynamic" or "hot") data. Using the classification, the system stores the rarely-updated data and frequently-updated data in separate superblocks. This sort of separation increases the compaction efficiency. In contrast, if rarely-updated and frequently-updated data were to be stored in the same superblock, the system may have to copy rarely-updated data to another superblock unnecessarily, in order to be able to erase the superblock, even though the rarely-updated data has few "holes." In some embodiments, system 20 assesses the update frequency of the data (e.g., by recording the most recent time at which each logical address was programmed). Using this assessment, the system can assign rarely-updated data and frequently-updated data to separate superblocks.

In some embodiments, when a certain block in a super-block fails, system 20 redefines the superblock to have a smaller number of blocks. The failed block is thus removed from the redefined superblock. Consider, for example, a scheme in which each superblock comprises N blocks having corresponding physical addresses in N different memory units (dies in the present example). The N blocks in each superblock comprise N−1 data blocks and a redundancy block. In an embodiment, if a certain block in a given superblock fails (typically marked by the system as a bad block), the system redefines the superblock to include only the remaining N−1 blocks, e.g., N−2 data blocks and a redundancy block. If another block in the superblock fails, the process may continue by redefining the superblock to include a total of N−2 blocks.

This technique avoids the need to redefine the entire assignment of blocks to superblocks in the system in the event of block failure. In other words, the effect of a failed block is confined to the superblock containing that failed block. Although the description above refers to a scheme in which each superblock comprises blocks having corresponding physical addresses in multiple dies, the disclosed technique is not limited to this assignment and can be used in superblocks having any other suitable block selection.

In the above embodiments, the system stores data in K blocks of a given superblock and redundancy information in the remaining N−K pages of the given superblock. In alternative embodiments, however, there is no dedicated partitioning between blocks used for storing data and blocks used for storing redundancy information. For example, the data and redundancy information in a given superblock may be interleaved over the N blocks, such that at least one of the blocks (and often all N blocks) in the superblock comprises both data and redundancy information.

Host-Assisted Redundant Storage

As explained above, system 20 receives from host 24 data that is addressed using logical addresses, and stores the data in respective physical storage locations in memory devices 28. The translation between logical addresses and physical storage locations is performed in accordance with a logical-physical address mapping that is defined and updated by main controller 52.

In some of the redundant storage configurations described herein, the redundancy scheme is defined and carried out entirely within system 20. In these configurations, the host has no knowledge or involvement in the redundant storage process, and may not even be aware that redundancy information is produced and stored. The following description, on the other hand, presents embodiments in which the redundancy scheme is applied by the host, based on information regarding the logical-to-physical address mapping that is provided by system 20.

In some embodiments, main controller 52 provides to host 24 information regarding the logical-physical address mapping. In particular, the information provided by controller 52 indicates which logical addresses are mapped to each die. For example, controller 52 may send to host 24 a set of logical address ranges, each range comprising the logical addresses mapped to a respective die. Using this information, the host can cause a particular data item to be stored in a particular die, by assigning this data item a logical address that is mapped to the desired die. In other words, the information reported by controller 52 enables the host to control the physical storage locations in which system 20 will store data, even though system 20 applies logical-to-physical address translation. This mechanism enables the host to implement various redundancy schemes in system 20, by assigning appropriate logical addresses to the data.

For example, the host may generate redundancy information for certain data, and assign the data and the redundancy information logical addresses that cause them to be stored in different dies. In an example embodiment, the host accumulates N−1 data pages, and calculates a redundancy page over the data using bit-wise XOR. Then, the host assigns the N−1 data pages and the $N^{th}$ redundancy page N logical addresses, which cause the N pages to be stored in N different dies. The host is able to assign the logical addresses appropriately, based on the information regarding the logical-physical mapping that is reported by controller 52. In alternative embodiments, the host can use information regarding the logical-physical mapping to implement any suitable redundant storage scheme, such as various RAID schemes.

Since the logical-physical address mapping typically changes over time, system 20 typically updates the host with these changes. The updates can be reported as they occur, or on a periodic basis. In some embodiments, system 20 and host 24 support an interface, over which controller 52 reports the information regarding the logical-physical address mapping to the host.

Figure 5:
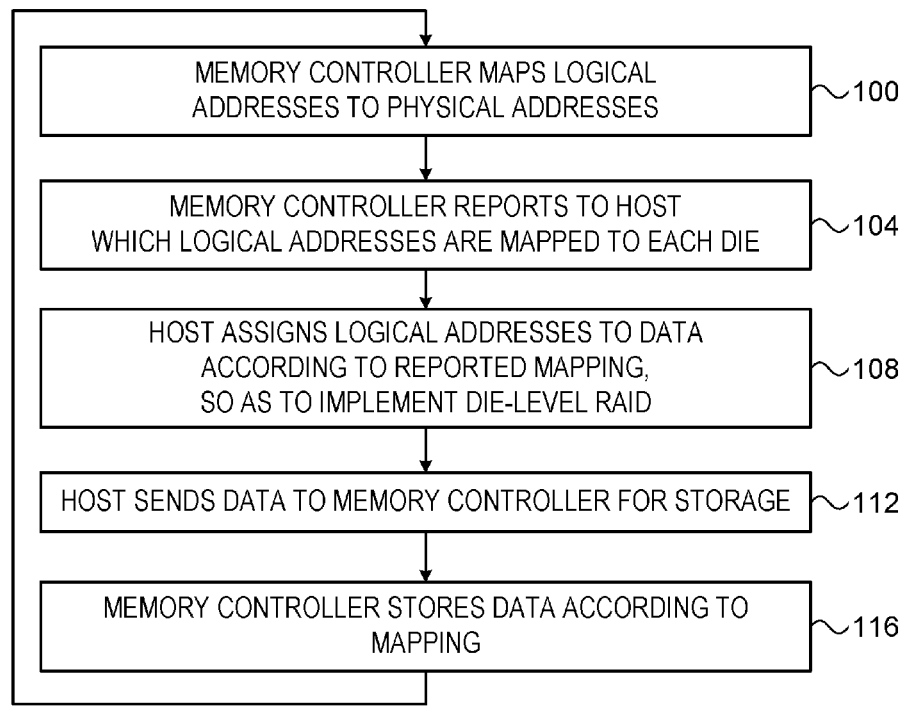
FIG. 5 is a flow chart that schematically illustrates a method for redundant data storage, in accordance with another embodiment.

FIG. 5 is a flow chart that schematically illustrates a method for redundant data storage, in accordance with another embodiment. The method begins with main controller 52 in system 20 defining a mapping between logical addresses and physical storage locations, at a mapping definition step 100. Controller 52 reports information regarding the mapping to host 24, at a mapping reporting step 104. In particular, controller 52 indicates to host 24 which logical addresses are mapped to each die.

When preparing to store data in system 20, host 24 assigns logical addresses to the data based on the reported information regarding the mapping, at an address assignment step 108. Typically, the host produces redundancy information for the data. Then, the host assigns the data and the redundancy information logical addresses, which will cause system 20 to store them in different dies. The host may implement any suitable redundancy scheme in system 20 using this technique, such as various RAID schemes.

Host 24 sends the data and redundancy information to controller 52 in system 20 for storage, at a sending step 112. Each data item (including data and redundancy information) is sent with the respective logical address that was assigned at step 108 above. System 20 stores the data and redundancy information in memory devices 28, at a storage step 116. In the storage process, system 20 translates the logical addresses to respective physical storage locations according to the mapping, and stores the data items at these physical storage locations. Since the logical addresses were assigned by the host based on the reported mapping, each data item will be stored in a different die. If a certain die fails, host 24 can recover the data item stored on that die based on (1) the data items that is stored on the remaining dies and (2) the redundancy information.

Using Obsolete Blocks for Temporary Backup

In some embodiments, system 20 carries out a garbage collection process, which copies valid data from partially-valid blocks ("source blocks") and stores the data in a compact manner in other blocks ("destination blocks"). Once all valid data is copied from a given source block, the source block is regarded as obsolete and may be erased.

In some embodiments, system 20 uses the obsolete data that is stored in obsolete source blocks as temporary backup, and recovers the data from the obsolete blocks in the event of failure in the destination blocks. In some embodiments, system 20 implements this temporary backup scheme by (1) specifying that the source and destination blocks of any given data item will reside in different dies, and (2) delaying erasure of obsolete blocks as much as possible. These two guidelines increase the likelihood that, when a given die fails, the data of this die can still be recovered from obsolete blocks that formerly held the data.

Figure 6:
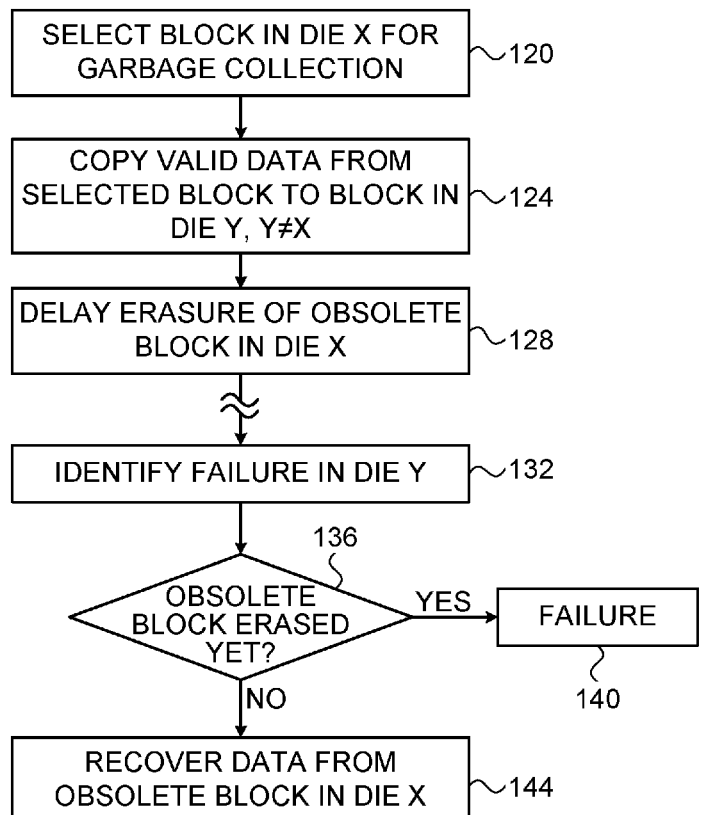
FIG. 6 is a flow chart that schematically illustrates a method for recovery from die failure, in accordance with another embodiment.

FIG. 6 is a flow chart that schematically illustrates a method for garbage collection and recovery from die failure, in accordance with another embodiment. The method begins with system 20 selecting a source block for garbage collection, at a source selection step 120. The selected source block resides in a certain die, denoted die X. System 20 then selects a destination block for copying the valid data from the source block, at a destination selection step 124. System 20 selects the destination block in a die denoted Y, which is different from die X. System 20 copies the valid data from the source block in die X to the destination block in die Y. System 20 then marks the source block as obsolete, i.e., ready for erasure.

In some embodiments, system 20 delays the actual erasure of the source block, at a delaying step 128. The delay in erasure extends the time period in which the data in the source block, although marked as invalid, is still available for readout if necessary. System 20 can delay erasure of the source block in various ways. For example, system 20 may hold the obsolete blocks without erasing them, until a new block is needed for programming. As another example, the system may hold a relatively small pool of blocks that are erased and ready for programming, and delay erasure of the remaining obsolete blocks.

At a certain point in time, system 20 identifies a failure in die Y (the die comprising the destination block), at a failure detection step 132. System 20 then checks whether an obsolete replica of the data of die Y is still available for recovery. In particular, for the destination block in question, system 20 checks whether the obsolete source block in die X (from which the data was copied to the destination block) has been erased, at an erasure checking step 136. If the obsolete source block was erased, the method terminates without recovering the data, at a failure termination step 140. If, on the other hand, the obsolete source block in die X was not erased yet, system 20 recovers the data in question by reading it from the source block, at a recovery step 144.

Typically, the scheme of FIG. 6 does not provide guaranteed backup, since the data is available for recovery only until the obsolete block is erased. On the other hand, this scheme provides some degree of backup without requiring additional memory or other system resources.

In the above embodiments, the source and destination blocks are selected in different dies. In alternative embodiments, however, the source and destination blocks may be selected in the same die, and the disclosed technique can be used for recovery from failure in the source block.

Redundancy Schemes Using Logical Addressing

In some embodiments, system 20 implements a redundancy storage scheme based on the logical addresses (sometimes referred to as Logical Block Addresses—LBAs) that are assigned to the data by the host. In an example embodiment, main controller 52 in system 20 assigns a dedicated LBA for each group of N−1 LBAs assigned by the host. The dedicated LBA (also referred to as "redundancy LBA") is used for storing redundancy information that is computed over the data of the N−1 LBAs in the group (also referred to as "host LBAs"). Controller 52 typically assigns the redundancy LBAs in a range of LBAs that is not accessible to host 24.

Typically, system 20 ensures that each of the N LBAs in the group (the N−1 host LBAs and the redundancy LBAs) is stored in a different die. For example, when defining the logical-physical address mapping, controller 52 may assign each die a certain respective range of LBAs, which does not overlap the ranges assigned to the other dies. Then, when selecting a group of N−1 LBAs for redundant storage, controller 52 selects each LBA from the range of a different die. Alternatively, controller 52 may ensure or verify that each LBA in the group maps to a different die using any other suitable method.

When using this sort of redundant storage for random write operations, any update of one of the host LBAs causes two programming operations—one programming operation of the updated host LBA and one programming operation of the redundancy LBA. Therefore, controller 52 attempts to avoid situations in which the redundancy LBAs are assigned in the same die or in a small group of dies. A situation of this sort would cause severe cycling and wear of the die or dies holding the redundancy LBAs. Thus, in some embodiments, controller 52 attempts to distribute the redundancy LBAs of different LBA groups across multiple dies. For sequential programming, the updating overhead is smaller. Therefore, this technique is particularly useful in applications that are dominated by random write operations, e.g., in transaction servers. Nevertheless, the technique is useful for sequential storage applications, as well.

Additionally or alternatively, system 20 may store the redundancy LBAs using a storage configuration that is more resilient to severe cycling, in comparison with the storage configuration used for storing the host LBAs. For example, system 20 may partition each die into two subsets of memory cells. One subset, referred to as a high-endurance area, stores data at a lower density (lower number of bits/cell, smaller number of programming levels), but on the other hand at a higher endurance. The other subset, referred to as a high-density area, stores data at a higher density, but at a lower resilience to cycling. System 20 stores the host LBAs in the high-density area, and the redundancy LBAs in the high-endurance area.

Because of the lower storage density in the high-endurance area, the memory cells in this area can tolerate considerably more endurance, i.e., higher numbers of programming and erasure cycles, relative to the memory cells in the high-density area. As such, it is preferable to store the redundancy LBAs in the high-endurance area. This technique, however, causes some degradation in capacity due to the lower storage density in the high-endurance area.

System 20 can define the high-endurance and high-density storage configurations in any desired manner. For example, the system may store the host LBAs in the high-density area using N programming levels (programming states) per cell, and store the redundancy LBAs in the high-endurance area using M programming levels, M<N. In an example embodiment, system 20 stores the host LBAs using a Multi-Level Cell (MLC) configuration having four levels or eight levels, and the redundancy LBAs using a Single-Level Cell (SLC) configuration having two programming levels. As another example, the host LBAs may be stored using three programming levels, and the redundancy LBAs using two bits/cell (SLC). Alternatively, any other suitable values of N and M can be used.

Figure 7:
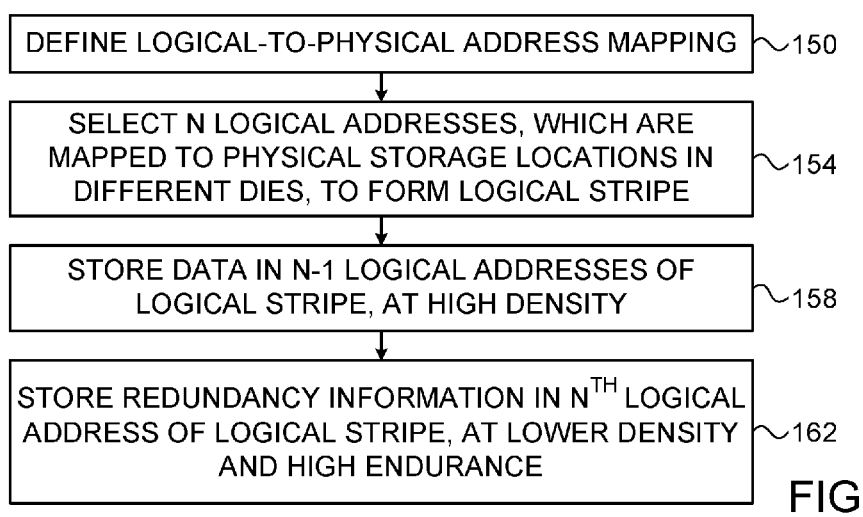
FIG. 7 is a flow chart that schematically illustrates a method for redundant data storage using logical address redundancy, in accordance with another embodiment.

FIG. 7 is a flow chart that schematically illustrates a method for redundant data storage using logical address redundancy, in accordance with another embodiment. The method begins with main controller 52 defining a mapping between logical addresses (LBAs) and physical storage locations, at a mapping specification step 150. Controller 52 selects N LBAs that are mapped to N respective physical storage locations in N different dies, at a group selection step 154. One of the N LBAs (the redundancy LBA) is selected from a range of LBAs that is not accessible to the host, and is designated for storing redundancy information. The other N−1 are referred to as host LBAs. The group of N LBAs is referred to as a logical stripe.

Controller 52 stores incoming data from the host in the host LBAs, and redundancy information in the redundancy LBA. Consider, for example, new data that arrives from the host and is addressed to one of the host LBAs in the group. Upon receiving this data, controller 52 updates the redundancy information for this group to reflect the new data. Controller 52 then stores the data in the host LBA, at a first storage step 158, and the updated redundancy information in the redundancy LBA, at a second storage step 162. In some embodiments, controller 52 stores the host LBA at high density (e.g., in a high-density area assigned in the respective die), and the redundancy LBA at a high-endurance configuration (e.g., in a high-endurance area assigned in the respective die).

The description of FIG. 7 refers to a single logical stripe, i.e., a single group of N LBAs. Generally, however, system 20 defines multiple logical stripes. In an example embodiment, the entire range of LBAs is divided into logical stripes, i.e., groups of N LBAs. Data storage within each logical stripe is carried out using the method of FIG. 7.

Recovery From Die Failure Using ECC

In some embodiments, system 20 protects the stored data from die failures by encoding the data with an ECC, and distributing the bits of each ECC code word over multiple dies. Consider, for example, a group of thirty-three dies. In an example embodiment, system 20 encodes incoming data, to produce ECC code words. Each code word comprises multiple bits, e.g., several hundred or several thousand bits. System 20 distributes (interleaves) the bits of each code word across the thirty-three dies. If any single die fails, approximately 3% of the bits in each code word will be lost. For a properly chosen ECC, the entire data can be recovered from the code words in the absence of the 3% lost bits.

In some embodiments, the lost bits can be pointed out to the ECC decoder as erasures, since the identity of the failed die is often known. Some ECC types, such as Reed-Solomon (RS) or Low-Density Parity Check (LDPC) codes, have a considerably higher correction capability when provided with erasure information. This technique is useful not only for die failures that cause total data loss, but also for failures that cause high bit error rate on one or more dies. In alternative embodiments, the bits are associated with respective soft metrics (e.g., Log Likelihood Ratios—LLRs), and the ECC decoder decodes the code word using the soft metrics.

In some embodiments, system 20 may apply any of the redundant storage techniques disclosed herein (e.g., any of the disclosed logical and/or physical addressing schemes, and/or any other disclosed techniques for using spare memory units) in storing the subsets of bits of the ECC code word in the multiple memory units.

Spare Dies for Replacing Failed Dies

In some embodiments, system 20 comprises one or more spare dies that are reserved for replacing failed dies. In some embodiments, a spare die is not used for storing data until it replaces a failed die. In alternative embodiments, the spare dies provide additional physical storage space, which can be used for storing data at improved performance. In the event of die failure, less physical space is available, but the available physical space still meets the system specification. Any of the redundant storage techniques described herein can be used in conjunction with spare dies.

Consider, for example a system that normally performs redundant storage in N dies. In such a system, an N+1$^{th}$ die can be added. The N+1$^{th}$ is not used as long as the other N dies are functional. If one of the N dies fails, the data stored in the failed die can be recovered based on the redundancy information, and copied to the spare die. From that point, the system can continue to operate with N dies as before. In some embodiments, the data of the failed die can be restored to the spare die gradually. For example, whenever certain data is accessed, the data is restored and then programmed to the spare die. Alternatively, the entire content of the failed die can be restored upon detecting that the die has failed. In some embodiments, when memory devices 28 comprise Dual-Die Packages (DDP), the system inherently comprises a spare die.

In alternative embodiments, the spare dies are used during normal operation, and therefore increase the ratio between physical storage space and the logical address range accessible by the host. During normal operation, the additional physical storage space can be used for various purposes. For example, the additional physical space can used to increase the Over-Provisioning ratio of system 20, i.e., the average number of invalid data regions ("holes") per block. Higher over-provisioning overhead increases the efficiency of the garbage collection process, and therefore improves programming throughput. When a certain die fails and is replaced by a spare die, the over-provisioning overhead decreases due to the lower available physical storage space.

Hierarchical Calculation of Redundancy Information

In the different redundant storage schemes described above, system 20 computes redundancy information for data items that are stored on multiple dies. In some embodiments, system 20 can distribute this computation over multiple processors, such that each processor computes partial redundancy information for the dies it is associated with. In these embodiments, it is assumed that the redundancy calculation can be partitioned into several independent sub-calculations whose results can be subsequently combined. Exclusive OR (XOR) redundancy, for example, meets this condition.

Consider, for example, the configuration of FIG. 1 above, and consider a configuration in which the redundancy information is computed over dies that are located in all memory devices 28. In some embodiments, the redundancy information can be computed in a centralized manner by main controller 52. Alternatively, however, each MSP 40 can calculate partial redundancy information over the dies it is responsible for. Then, main controller 52 can combine the multiple partial redundancy information in order to derive the total redundancy information pertaining to all the dies.

As another example, each MSP 40 calculates partial redundancy information over its respective dies, and each channel controller combines the partial redundancy information from its respective MSPs to produce a channel-level result. The main controller combines the channel-level results of the channel controllers to produce the total redundancy information. Alternatively, system 20 can partition the redundancy computation in any other suitable manner. This technique reduces the computational burden on the main controller and channel controllers, and also increases storage speed.

Fast Readout of Redundantly-Stored Data

As described above, in some embodiments the memory controller stores data in N memory units (e.g., dies), and redundancy information for the data in an N+1$^{th}$ memory unit. In order to retrieve the data, the memory controller issues read commands to the memory units. In some practical cases, however, some memory units may be slow in responding to the read commands. For example, a given memory unit may be busy with another task (e.g., erasure, read threshold estimation, programming or readout) and will therefore respond after a relatively long delay. In some embodiments, the memory controller reduces the sensitivity of the readout process to delays by reconstructing the data without waiting for the slowest memory unit.

In an example embodiment, the memory controller issues a respective read command to each of the N+1 memory units, including both the N memory units holding the data and the N+1$^{th}$ memory unit holding the redundancy information. As soon as the first (fastest) N memory units respond, the memory controller reconstructs the data from the N responses without waiting for the N+1$^{th}$ response. In some cases, the first N memory units to respond are the ones holding the data (i.e., the memory unit holding the redundancy information is the slowest), in which case the memory controller has all the data ready. In other cases, the first N memory units to respond are N−1 of the memory units holding the data, and the memory unit holding the redundancy information. In this case, the memory controller reconstructs the data of the remaining memory unit, which has not yet responded, based on the data read from the other N−1 memory units and the redundancy information read from the N+1$^{th}$ memory unit.

Figure 8:
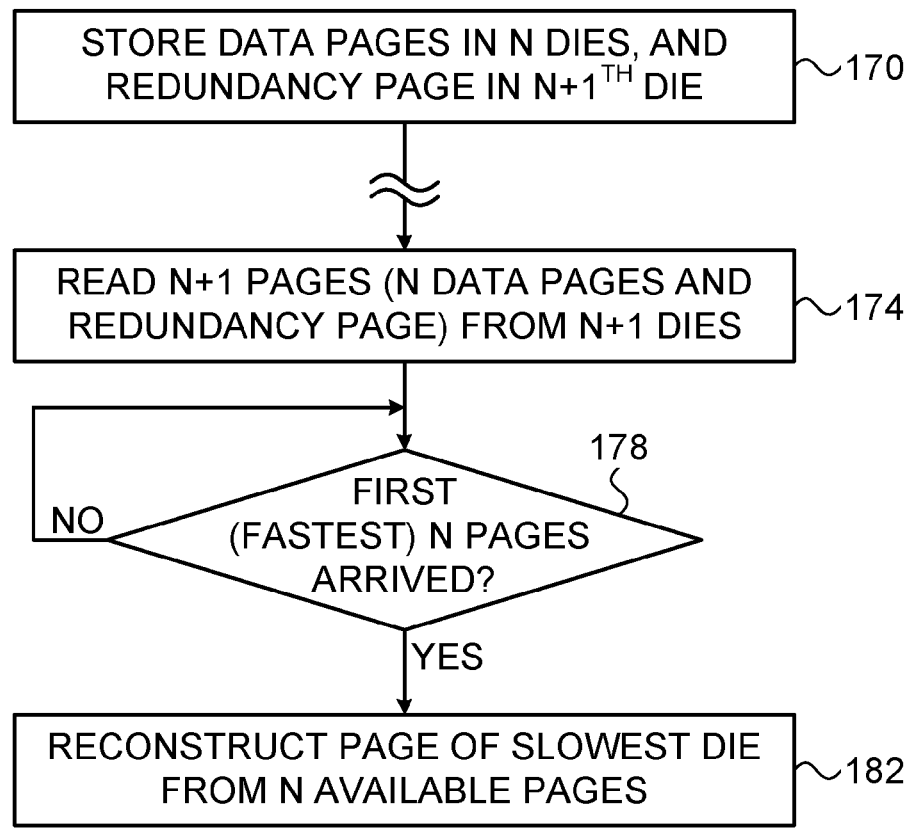
FIG. 8 is a flow chart that schematically illustrates a method for redundant data readout, in accordance with an embodiment.

FIG. 8 is a flow chart that schematically illustrates a method for redundant data readout, in accordance with an embodiment. The method begins with the memory controller storing N data units (N data pages in the present example) in N respective dies, and a redundancy data unit (a redundancy page in the present example) holding redundancy information for the data in an N+1$^{th}$ die, at a redundant storage step 170. The memory controller may use any suitable redundancy scheme, such as any of the schemes described above.

At a later time, the memory controller is requested to retrieve the store data. In order to retrieve the data, the memory controller issues N+1 read commands to the N+1 dies in question, at a read instruction step 174. The memory controller waits until the first (fastest) N pages arrive, at an arrival checking step 178. As soon as the first N pages arrive, the memory controller reconstructs the data based on these N pages, at a data reconstruction step 182, irrespective of the N+1$^{th}$ page. If the first N pages are the data pages, the data is already available. If the first N pages are N−1 data pages and the redundancy page, the memory controller reconstructs the data of the $N+1^{th}$ page based on the N data pages and the redundancy page. The memory controller then outputs the reconstructed data. Using this technique, a die (or other memory unit) that is slow to respond to readout commands does not delay the entire readout process.

In some embodiments, system 20 supports an interface using which the memory units report their expected response latencies to the memory controller. In n example embodiment, the memory controller queries each memory unit before retrieving the data, and in return each memory unit reports its expected response latency. The memory controller selects the N memory units having the lowest expected latencies (from among the N+1 memory units in question), and issues read commands only to the N selected memory units. If two or more memory units report the same expected latency, the memory controller may choose between them according to another criterion, e.g., the memory units having the smallest number of pending read requests. Alternatively, any other suitable criterion can be used.

In some embodiments, the slow response time of a given die may be caused by various background tasks (e.g., garbage collection and/or housekeeping tasks) that are performed by the memory controller on the memory units. In some embodiments, the memory controller schedules background tasks in the different memory units (e.g., dies), so as to enable fast readout. For example, the memory controller may schedule background tasks in the N+1 memory units using "round robin" scheduling, such that at any given time there are N memory units that are not busy executing background tasks.

In some cases, the $N+1^{th}$ memory unit was slow to respond because the read thresholds that were used for reading the memory cells were not positioned properly. In some embodiments, after successfully reconstructing the data based on the other N readout results, the memory controller provides the reconstructed data of the $N+1^{th}$ memory unit to the $N+1^{th}$ memory unit. This data can be used by the $N+1^{th}$ memory unit, for example, to find the correct locations of the read thresholds. In alternative embodiments, the reconstructed data provided to the $N+1^{th}$ memory unit by the memory controller can be used by the $N+1^{th}$ memory unit to improve, speed-up or generally enable subsequent readout in any other suitable way.

In the above embodiments, the memory controller stores data in N memory units and redundancy information in an $N+1^{th}$ memory unit, and recovers the data using the N memory units that are fastest to respond to read requests. In alternative embodiments, the memory controller may store data in a total of N+K memory units, such that N memory units hold data and the remaining K memory units hold redundancy information. The memory controller then may recover the data using any partial subset of the memory units that are fastest to respond.

In the above embodiments, the memory controller issues read requests to all N+K memory units. In some embodiments, however, the memory controller may issue less than N+K read commands. For example, the memory controller may have information indicating that a given memory unit is busy with another task. In this scenario, the memory controller may a-priori refrain from issuing a read command to this memory unit, and prefer to recover the data from the remaining memory units.

Fast Redundant Programming of Burst Data

In some embodiments, the memory controller applies a programming scheme that stores incoming data efficiently in RAID stripes, and performs redundancy information updates only during block compaction ("garbage collection"). In an example embodiment, the memory controller stores data in groups of N logical pages that are referred to as RAID stripes. Each RAID stripe comprises a certain amount of incoming user data (e.g., N–K pages) and a certain amount (e.g., K pages) of redundancy information computed over the user data. The memory controller maintains a database of pointers that point to the physical storage addresses of the N pages in each RAID stripe, which are typically distributed over N memory units.

As user data arrives, the memory controller arranges the data, with redundancy information, in RAID stripes and stores the RAID stripes in the memory units. Since each all N pages of a given RAID stripe are stored at the same time, there is no need for updating of redundancy information during programming. As a result, the programming process is fast and efficient.

During the background compaction process, the memory controller selects for compaction memory blocks, which contain some invalid pages. Each invalid page belongs to a certain RAID stripe. The memory controller applies compaction by reading one or more invalid pages, reading the redundancy information of the RAID stripe(s) to which these invalid pages belong, replaces the data of the invalid pages with new data, updates the redundancy information based on the invalid pages and the new data, and writes the new data and the updated redundancy information to new physical storage locations. Finally, the memory controller updates the pointer database with the new physical storage locations of the new data and the updated redundancy information.

This scheme is advantageous, for example, in applications where programming commands arrives in short bursts. In such applications, the programming throughput is not degraded by redundancy information updates. All redundancy updates are performed during the background compaction process.

The embodiments described herein refer mainly to redundant storage schemes in which resilience to failure is achieved by using memory units that reside on different dies or memory devices. In alternative embodiments, however, the memory units that are referred to in the disclosed schemes may comprise logical memory units, which do not necessarily reside on different dies or devices. For example, a given memory die may be partitioned into two or more logical memory units, each logical memory unit comprising a respective subset of the address space of that die. Any of the methods and systems described herein can be carried out using such logical memory units. Hybrid solutions, in which memory units are distributed on different dies but each die may comprise more than one memory unit, are also possible.

It will be appreciated that the embodiments described above are cited by way of example, and that they are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art.

What is claimed is:

1. An apparatus, comprising,
a plurality of memory devices; and
a controller configured to:
  receive a request to retrieve a plurality of data pages stored in the plurality of memory devices, wherein a particular data page of the plurality of data pages is stored in a particular memory device of the plurality of memory devices, and wherein a redundant data page associated with the plurality of data pages is stored in another memory device of the plurality of memory devices;

send, in response to receiving the request, a first read command to each memory device of the plurality of memory devices to read a respective data page of the plurality of data pages;

receive the plurality of data pages from the plurality of memory devices; and reconstruct a given data page of the plurality of data pages using a subset of the plurality of data pages, wherein each data page included in the subset of the plurality of data pages is received prior to the given data page.

2. The apparatus of claim 1, wherein the subset of the plurality of data pages includes the redundant data page.

3. The apparatus of claim 1, wherein the controller is further configured to query each memory device for an expected latency for responding to a command.

4. The apparatus of claim 3, wherein the controller is further configured to select a subset of the plurality of memory devices using the expected latency for each memory device of the plurality of memory devices.

5. The apparatus of claim 4, wherein the controller is further configured to send a second read command to each memory device included in the subset of the plurality of memory devices to read the respective data page of the plurality of data pages.

6. The apparatus of claim 4, wherein to select the subset of the plurality of memory devices, the controller is further configured to, in response to a determination that an expected latency of a first memory device is the same as an expected latency of a second memory device, select between the first memory device and the second memory device based on a first number of read requests pending for the first memory device and a second number of read requests pending for the second memory device.

7. A method, comprising:

receiving a request to retrieve a plurality of data pages stored in a plurality of memory devices, wherein a particular data page of the plurality of data pages is stored in a particular memory device of the plurality of memory devices, and wherein a redundant data page associated with the plurality of data pages is stored in another memory device of the plurality of memory devices;

sending a read command to each memory device of the plurality of memory devices to read a respective data page of a plurality of data pages;

receiving the plurality of data pages from the plurality of memory devices; and reconstructing a given data page of the plurality of data pages using a subset of the plurality of data pages, wherein each data page included in the subset of the plurality of data pages is received prior to the given data page.

8. The method of claim 7, wherein the subset of the plurality of data pages includes the redundant data page.

9. The method of claim 7, further comprising determining a respective expected latency for responding to a command for each memory device of the plurality of memory devices.

10. The method of claim 9, further comprising selecting a subset of the plurality of memory devices using the respective expected latency for each memory device of the plurality of memory devices.

11. The method of claim 10, further comprising sending a second read command to each memory device included in the subset of the plurality of memory devices to read the respective data page of the plurality of data pages.

12. The method of claim 11, further comprising receiving respective data pages from each memory device included in the subset of the plurality of memory devices, and reconstructing another data page of the plurality of data pages using the respective data pages received from each memory device included in the subset of the plurality of memory devices.

13. The method of claim 12, further comprising sending the the another data page to a given memory device of the plurality of memory devices, wherein the given memory device is excluded from the subset of the plurality of memory devices.

14. A system, comprising, a host processor; and a storage device coupled to the host processor, wherein the storage device includes a plurality of memory devices, wherein the storage device is configured to:

receive a request to retrieve a plurality of data pages stored in the plurality of memory devices, wherein a particular data page of the plurality of data pages is stored in a particular memory device of the plurality of memory devices, and wherein a redundant data page associated with the plurality of data pages is stored in another memory device of the plurality of memory devices send, in response to receiving the request, a first read command to each memory device of the plurality of memory devices to read a respective data page of the plurality of data pages;

receive the plurality of data pages from the plurality of memory devices; and reconstruct a given data page using a subset of the plurality of data pages, wherein each data page included in the subset of the plurality of data pages is received prior to the given data page.

15. The system of claim 14, wherein the subset of the plurality of data pages includes the redundant data page.

16. The system of claim 14, wherein the storage device is further configured to determine a respective expected latency for responding to a command for each memory device of the plurality of memory devices.

17. The system of claim 16, wherein the storage device is further configured to select a subset of the plurality of memory devices using the respective expected latency for each memory device of the plurality of memory devices.

18. The system of claim 17, wherein to select the subset of the plurality of memory devices, the storage device is further configured to, in response to a determination that an expected latency of a first memory device is the same as an expected latency of a second memory device, select between the first memory device and the second memory device based on a first number of read requests pending for the first memory device and a second number of read requests pending for the second memory device.

19. The system of claim 17, wherein the storage device is further configured to send a second read command to each memory device included in the subset of the plurality of memory devices to read the respective data page of the plurality of data pages.

20. The system of claim 19, wherein the storage device is further configured to receive respective data page from each memory device included in the subset of the plurality of memory devices, and reconstruct another data page of the plurality of data pages using the respective data pages received from each memory device included in the subset of the plurality of memory devices.

\* \* \* \* \*